United States Patent [19]
Pfeiffer et al.

[11] Patent Number: 5,633,507
[45] Date of Patent: May 27, 1997

[54] ELECTRON BEAM LITHOGRAPHY SYSTEM WITH LOW BRIGHTNESS

[75] Inventors: Hans C. Pfeiffer; Werner Stickel, both of Ridgefield, Conn.

[73] Assignee: International Business Machines Corporation, Armonk, N.Y.

[21] Appl. No.: 530,448

[22] Filed: Sep. 19, 1995

[51] Int. Cl.$^6$ .................................................. H01J 37/30
[52] U.S. Cl. ...................... 250/492.23; 250/492.22; 250/398; 250/423 R; 250/423 F; 313/336; 313/346 R
[58] Field of Search .................... 250/492.23, 492.22, 250/398, 423 R, 423 F, 310; 313/336, 346 R; 315/3, 5.33

[56] References Cited

U.S. PATENT DOCUMENTS

| | | | |
|---|---|---|---|
| 4,346,325 | 8/1982 | Nakahiji et al. | 313/336 |
| 4,430,570 | 2/1984 | Takigawa et al. | 250/423 R |
| 4,591,754 | 5/1986 | Hagiwara et al. | 313/336 |
| 5,545,902 | 8/1996 | Pfeiffer et al. | 250/492.23 |

*Primary Examiner*—Jack I. Berman
*Assistant Examiner*—Kiet T. Nguyen

[57] ABSTRACT

An electron beam system for direct writing applications employs an electron gun having a large emitting surface compared to the prior art and a brightness approximately two orders of magnitude less than prior art systems to illuminate an initial aperture uniformly with a slightly diverging beam that passes efficiently through the aperture, a first set of controllable deflectors to scan the beam over the reticle parallel to the system axis, impressing the pattern of a subfield of the reticle in each exposure, in which a first variable axis lens focuses an image of the initial aperture on the reticle, a second variable axis lens collimates the patterned beam, a second set of controllable deflectors to bring the beam back to an appropriate position above the wafer, and a third variable axis lens to focus an image of the reticle subfield on the wafer, together with correction elements to apply aberration corrections that may vary with each subfield, thereby providing high throughput from the use of parallel processing of the order of $10^7$ pixels per subfield with the low aberration feature of the variable axis lens and the ability to tailor location-dependent corrections that are associated with gaussian systems that stitch the image pixel by pixel.

18 Claims, 7 Drawing Sheets

IDEAL DOUBLET

INTERACTION & GEOMETRICAL ABERRATIONS

ABERRATIONS [nm]

V=100kV, I=50uA, SF=0.25mm, M=1/4, L=500mm,

NUMERICAL APERTURE →

ELECTRON BEAM LITHOGRAPHY SYSTEM WITH LOW BRIGHTNESS

TECHNICAL FIELD

The field of the invention is that of direr,-write electron beam systems for forming patterns on an integrated circuit wafer.

BACKGROUND ART

The classic e-beam system is a "probe-forming" system in which a narrow beam forms the image of the electron source. This source image has a gaussian-like spatial distribution and is scanned over the wafer or other target by an amount equal to a "pixel" at a time, the pixel being defined as the full width at half height of the intensity distribution. Such "Gaussian" systems have the lowest throughput of all probe forming systems due to the serial exposure of patterns one pixel at a time. They have, however, the advantage that corrections can be applied dynamically and pixel by pixel to compensate for aberrations of the electron lenses and deflection units in the system. "Shaped beam" systems have been developed to improve the throughput of the probe-forming systems by projecting a limited number (10–100) of pixels in parallel.

The highest throughput would be obtained with a projection system that projects all pixels in parallel. The classic e-beam projection system is modelled on optical projection systems. In the foreseeable future, chips may have a size of approximately 17 mm×35 mm, so that at a typical 4:1 demagnification ratio, the reticle will have a size of 70 mm×140 mm. Current technology is unable to produce an electron lens that will cover that size reticle with an acceptable fidelity at a nominal device groundrule corresponding to 0.25 µm or smaller critical dimension.

Throughput is essential if e-beam systems are to compete with light optical and X-ray systems. Therefore, mask projection would be the technique of choice for wafer exposure. A key requirement for high throughput is, of course, a highly intense beam. High power means great heat load on the reticle, which would lead to intolerable distortion of the reticle. An alternative approach to minimize thermal distortion of the reticle of a projection system is that of using a scattering reticle, as described in S. D. Berger & J. M. Gibson, APPL. PHYS. LETTERS 57 (2) (1990) 153, instead of an absorbing reticle. A scattering reticle requires an aperture above the wafer that preferentially absorbs scattered radiation having a greater scattering angle, thus translating scattering contrast into intensity contrast on the wafer.

In addition to covering a large area of the exposed surface, high throughput requires a low dwell time for each area that is being illuminated; i.e. that the amount of charge required to expose the photoresist be deposited in a short time and therefore that the current in the beam be high.

The art has long used a conventional measure called "brightness" and defined as: $B = I/(\pi\alpha^2)(\pi\alpha^2)$, where I is the total current in the beam, is the half angle of the beam envelope (the beam semi-angle) and r is the radius of the beam. As defined, brightness is essentially current density in position-angular phase space and is a constant of the system. The denominator of the brightness is proportional to the square of the emittance of the system (i.e. $\alpha r$). The emittance of the beam is the area it occupies in the phase plane. According to Liouville's theorem, the emittance is invariant throughout the system (see, e.g. M. Szilagyi, "Electron and Ion Optics", Plenum Press, NY 1988). Gaussian electron beam systems in the art use electron sources of small dimension (typically 10 µm or less), which are further demagnified by a factor of 10–100 to form an image that is inseparable from the beam source.

In those systems, the source is represented either by the narrowest waist of the beam in front of the emitter or cathode, usually referred to as a "cross-over", since the electron trajectories actually cross over each other, or by the back projection of the individual trajectories emerging from the cathode toward the point of virtual convergence behind the emitting surface ("virtual crossover"). The former is typical for thermionic systems having a beam diameter of the order of 10–30 µm, the latter for field emitter systems of the order of $10^{-3}$ µm.

In shaped beam systems used in the art the shape object (the aperture that determines the shape) is imaged rather than the source. Typical dimensions of the images at the target are in the order of a few µm, divergence angles of the order of a few mrad, and beam currents of a few µA or less. These parameters combine to establish a typical figure of brightness in the art of $10^5$–$10^6$ A/cm$^2$-sr. Since e-beam systems preserve the initial brightness to a good approximation, the beam preserves the initial density in phase space as it forms one or more images of the source.

Along the entire path from source to target, the electrons are subject to Coulomb repulsion, a component of which causes an effect equivalent to a diverging lens and can in principle be corrected, but another component of which causes trajectory displacements by a stochastic process that cannot be corrected. A third component causes spreading of the electron energy distribution leading to chromatic aberrations.

Whenever an image of the object is formed, the interactions are generally increased, so that systems that have a greater number of images of the object will have a greater amount of uncorrectable trajectory displacements than systems that have fewer images of the object, other things being equal.

SUMMARY OF THE INVENTION

The invention relates to a projection electron beam system for direct writing applications that achieves high throughput together with high resolution by employing an electron gun to illuminate a section of a circuit pattern on a reticle uniformly with a significantly lower brightness than in the prior art and significantly higher total beam current than in the prior art.

The lower brightness is achieved in spite of the greater current by the use of much greater area of the source.

The system further includes a first set of controllable deflectors to scan the beam over the reticle parallel to the system axis, thereby sequentially addressing all sub-sections or "subfields" of the reticle to be illuminated, a second set of controllable deflectors to bring the beam back to an appropriate position above the wafer, and lenses to form an image of the reticle subfield on the wafer. In an illustrative case of a subfield size on the wafer of 0.25 µmm on a side, there can be on the order of 1,000 lines or other features per side for 0.25 µm ground rules. In contrast, "cell projection" systems in the prior art cover only a few lines or a portion of a transistor.

The system thus provides high throughput from parallel processing of the order of $10^8$ pixels (a pixel being about 0.025–0.05 µm on a side) per subfield and achieves low dwell time by increasing the total beam current by a factor of about 10–100 over prior art systems.

BEST MODE OF CARRYING OUT THE INVENTION

Figure 1:
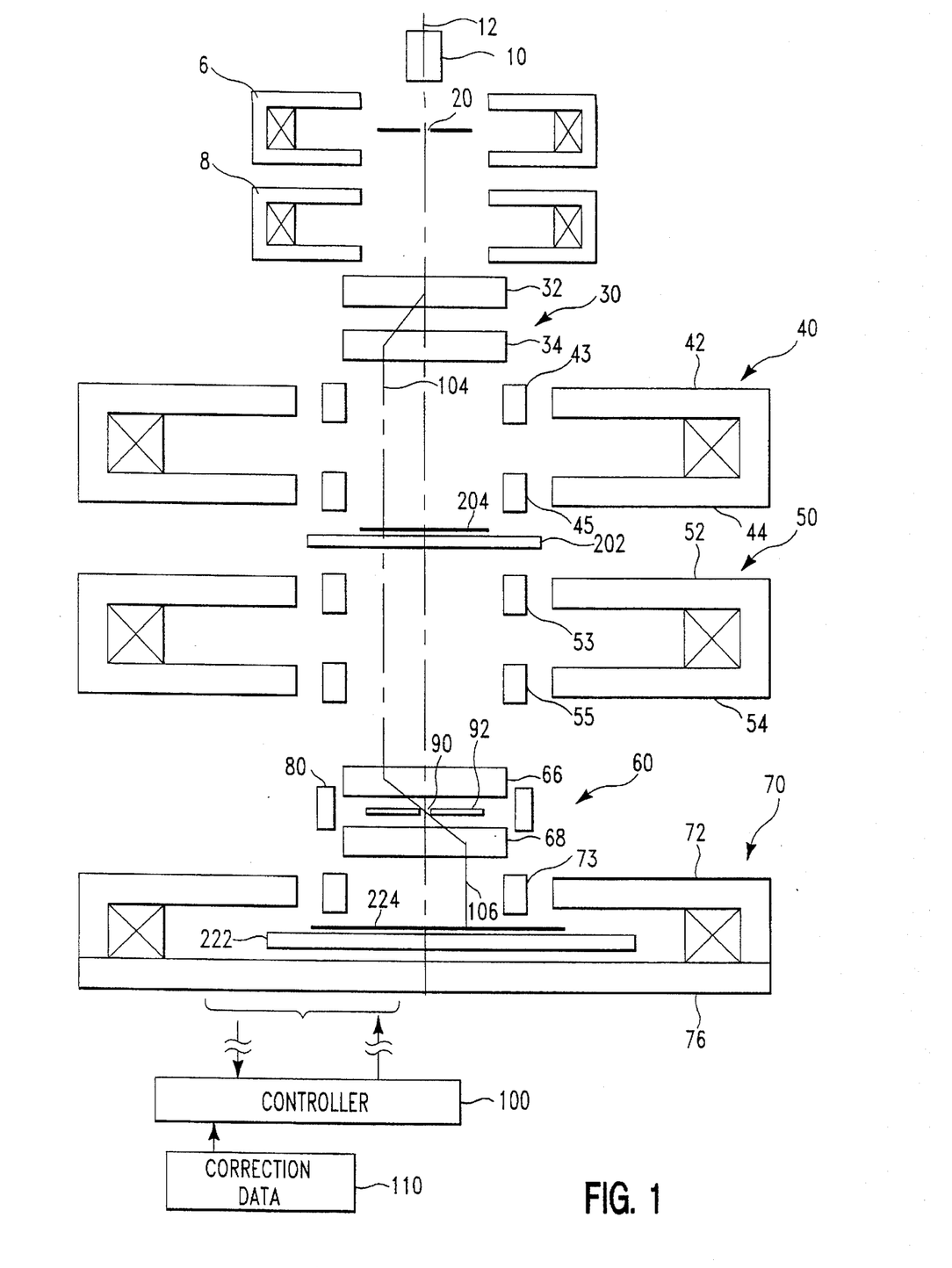
FIG. 1 illustrates in partially pictorial, partially schematic style, an embodiment of the invention.

Referring now to FIG. 1, there is shown in partially pictorial, partially schematic form, a first embodiment of the invention. At the top of the drawing, electron gun source 10 emits a diverging beam of electrons at a nominal energy of 100 KeV downwardly in the Z direction along system axis 12 through illuminating aperture 20, having a nominal dimension of 1 mm square in this example. The aperture size is chosen so that the electron distribution across this aperture is uniform within limits such that the intensity variation across the subfield on the wafer is acceptable. Typically, the uniformity limit is about 1–2% for e-beam systems. After passing through aperture 20, the beam is collimated (rendered parallel) by a conventional magnetic lens 8 acting as a condenser. The electron beam system will be described in more detail after the description of the overall system.

As will be described in more detail below, the beam is scanned across a reticle, acquiring a pattern representing a layer of an integrated circuit as it passes through the reticle; is deflected back toward the axis where it passes through a multi-purpose aperture; and is then directed on to the target.

In order to accommodate the system demand for a very large field, the beam will be scanned in steps sequentially across the surface of reticle 204. The beam is deflected by conventional deflection means 32 and 34 which have the capability to deflect the beam orthogonally to the Z-axis in the X direction (left and right in the drawing) and/or in the Y direction (in and out of the plane of the paper). The beam extends downward along second axis 104, (for convenience, the beam axis at the nth subfield of the reticle will be referred to as the "reticle axis"), through a first variable axis lens denoted generally by the numeral 40 and having upper and lower pole pieces 42 and 44. Axis shifting yokes 43 and 45 (referred to generally as axis-shifting means) superimpose their fields over the lens fields generated between the pole pieces 42 and 44 so that the combined fields are azimuthally symmetric about axis 104 in a region larger than the beam, as is taught in U.S. No. Pat. 4,376,249. With this arrangement, off-axis aberrations introduced by the lens are substantially reduced, thereby permitting the use of a large scan field that may exceed 10 μmm. Lenses of this type are referred to as variable axis lenses (VAL), since the optical axis of the lens is controllably shifted. The use of variable axis lenses provides high resolution electronic scanning of the reticle and wafer areas, which is complemented by mechanical scanning of the reticle and wafer as required to cover the entire chip real estate.

Beam 104 is focused onto reticle 204 by lens 40, thereby creating an image of aperture 20 on the reticle coincident in size with a reticle subfield. Illustratively, the aperture and reticle subfield are "comparable" in size, by which is meant that their transverse dimensions are within a factor of 2 or 3 of each other.

Beam 104 strikes the nth subfield of the reticle 204 and passes through it parallel to the Z axis. As it passes through the reticle, the beam is patterned with the information contained in the subfield. In the case of a conventional absorbing reticle, the beam will be absorbed in thick opaque areas and pass undisturbed through open areas. Ring-shaped ("doughnut") patterns are sequentially exposed in superposition of complementary reticles to compose the desired features as described in H. Bohlen et al., Solid State Technol., September (1984) 210. The system may be used with a differential scattering reticle or with a reticle of the type shown in FIG. 2.

Lens 50 in conjunction with the preceding lenses including lens 40 focuses an image of source 10 in the plane of aperture 90 as well as collimates the rays emerging from any one point on the reticle. Those skilled in the art will readily understand the constraints on element position and focal length imposed by this requirement. Rays coming from a subfield at an off-axis position are directed by the deflector 66 to the multipurpose aperture 90 that performs several functions as described below.

In Gaussian e-beam lithography systems in the prior art, the total beam current was approximately 1 microamp, and the effect of Coulomb interactions that cause uncorrectable spreading of the beam, was contained by other means, such as increasing the beam semiangle at the target at values that balance geometric aberrations and interactions. Indeed, the art made efforts to increase the brightness of systems by decreasing the area of the beam at focal planes, in particular by bringing the beam to a very sharp focus, referred to as a beam crossover, at or near the source.

In the range of energies and currents suitable for e-beam systems, the Coulomb force and geometrical aberrations are the dominant sources of image blurring because they cause the beam electrons to deviate from the "unperturbed" trajectories that are determined by the external forces exerted on the beam by lenses and deflectors. As is summarized in G. H. Jansen, in Advances in Electronics and Electron Physics, Supplement 21, Academic Press, Inc., 1990), image blur is a function of a number of variables and may be represented by: $f(q,m)I^iL^j/V^kr^l$, where q and m are the charge and mass of the beam particles, I, L, V, and r are the current in the beam, length of the path between reticle and wafer, accelerating voltage, and radius at the narrowest waist, of the beam, respectively and i,j,k, and 1 are exponents having values between ½ and ³⁄₂.

In a projection system according to the invention, the magnitude of I will be set in order to maximize throughput, (on the order of 50 μA). L will be chosen as small as possible in order to reduce Coulomb interactions, while V will be constrained, among other things (e.g. deflection drive, electronic limitations, etc.), by the scattering properties of the reticle. The remaining parameter r will be chosen as large as possible, so that loss of resolution is reduced by avoiding any substantial narrowing of the beam.

It is an advantageous feature of the invention that the image of a subfield on the wafer may be translated from the position where a full-chip projection system would place it. Thus, the subfields of the reticle can be projected by the system onto the wafer essentially independently of each other. Consequently, the requirements to be placed on the reticle regarding accuracy and stability can be drastically reduced, as the system can provide small corrections for the position of each subfield before and even during exposure. Furthermore, the capability of applying corrections on a subfield basis (a key advantage of probe-forming systems)

eliminates the need for the reticle pattern to be contiguous over the entire chip area. Consequently, a stronger reticle can be used in which the subfields are physically separated and reinforcing struts are used to support the reticle and to resist the distorting effects of the heat absorbed by the reticle such as that illustrated in S. D. Berger et al., J. Vac. Sci. & Technol. B 9 (6)(1991) 2996; or in J. A. Liddle et al., Ibid., P. 3000). The subfields on the wafer are adjusted in position in the X-Y plane so that they are contiguous, using the stitching capability of the system.

Deflectors 66 and 68 perform a translation inverse to that done above reticle 204 to bring beam 104 back to system axis 12 at aperture 90 and then to bend the beam to final beam 106 (for convenience, the beam axis at the nth subfield image on the wafer will be referred to as the "wafer axis"), traveling parallel to axis 12 and on the opposite side from beam 104. The point at which the beam crosses axis 12 will be referred to as the pivot point because the beam pivots through that point as it images various subfields. Variable axis immersion lens (VAIL) 70 together with variable axis lens 50 focuses beam 106 on to wafer 224, generating a demagnified image on the wafer of the pattern contained in the reticle subfield. Lens 70 is a particular form of VAIL in which a magnetically permeable plate 56 below wafer 224 provides a return path for the magnetic fields that focus the beam on wafer 224. In general, a VAIL can permit the beam to pass through.

The axis crossover at aperture 90 makes possible some advantageous features of the invention. One skilled in the art would think that, having reduced off-axis aberrations with axis-shifting yokes 43 and 45, it would be sufficient to continue beam axis 104 all the way down to wafer 224, with only a minor correction in displacement to stitch together the subfields on the wafer. The addition of any elements invariably introduces aberration, since no element is perfect. Thus, one skilled in the art would prefer to have only a single offset axis and to avoid the use of additional elements such deflectors 66 and 68. The addition of deflectors 66 and 68 and the deflection through the pivot point, however, decouples the two lens systems 40–50 and 70 from each other, to the extent that each can have its own optical axis on either side of the mechanical system axis, with the beam staying on these respective variable axes.

A first advantage of the axis crossover is that the beam can be steered at all times through one fixed pivot point on the symmetry axis 12 of the lens system at a location that can be chosen at will. Thus, there can be a single multi-purpose aperture 90 on the pivot point, instead of one aperture for each subfield. If the beam stayed on the same side of the system axis, an aperture plate containing one opening for each subfield would be required. This would not be practical because extremely stringent requirements for accuracy and stability comparable to those imposed on X-ray masks would have to be placed on such a multi-hole aperture plate under continuous high power electron bombardment. Aperture 90 has several purposes: to limit the image size of source 10 (by clipping the tails of the electron distribution); to block electrons strongly scattered in the reticle and therefore to create image contrast at the target; and to provide a means to sense beam current for alignment and other corrections. Accordingly, it will be sometimes referred to as a multipurpose aperture.

A second advantage is the ability to place elements for dynamic correction of aberrations (field curvature, astigmatism, distortion) symmetrically around the fixed pivot point, so that additional aberrations resulting from the scanning motion of the beam are minimized because the beam passes through the corrective elements concentrically.

Lenses 40 and 50 may be replaced by a VAIL that performs both functions and contains reticle 204 within it. Such a VAIL may be referred to either as a "dual" VAIL since it performs two focusing actions—one to focus a collimated beam on to reticle 204 and another to collimate the beam emerging from reticle 204; or it may be referred to as a "transmissive" VAIL, since it transmits the beam to the next element instead of stopping it. Such a lens may also be referred to as an immersion lens, in analogy to optical lenses, since the object (the reticle) is immersed in the focussing field defining the lens. Immersion is not required, and both the physical location along the Z-axis and the shape of the fields may be tailored as required to meet the requirements of a particular application.

ELECTRICAL AND MECHANICAL SCANNING

The exposure process requires synchronization of 4 independent scanning motions:

1. Electrical beam scan on the reticle
2. Mechanical scan of the reticle
3. Electrical beam scan on the wafer
4. Mechanical scan of the wafer Both electrical scans can be modified to correct for errors of the mechanical scans of reticle and wafer, and also to deliberately deviate from the mechanical scans to minimize overhead times at turn-around points.

In FIG. 1, beam 104 steps over reticle 204 in the X direction illustratively from right to left in the figure (with beam 106 stepping over wafer 224 simultaneously from left to right), while the reticle and wafer are scanned mechanically in the Y direction (in and out of the paper plane). The mechanical motion is not interrupted for exposures. Blurring of the image due to motion during exposure is avoided by deflecting the beam during the exposure (referred to as bucking the stage motion) to compensate for the stage motion. The beam is effectively limited to a small range in the Y dimension, say a few subfield rows, perpendicular to the X-Z plane. There is no need to scan the beam electrically by a large amount in the Y-direction, when a continuously moving stage is used, which accomplishes the result. However, X and Y electrical scanning can be combined with a mechanical "step & repeat" motion in order to employ a deflection system having a smaller deflection than that illustrated here.

TYPES OF RETICLES

The inventive system can be used with reticles of differing types, both conventional stencil reticles as illustrated in the Bohlen reference and "conventional" scattering reticles as illustrated in the Berger reference.

In stencil reticles, the beam passes through open apertures and is totally absorbed by the "opaque" portions. In this case, the contrast conversion feature of multi-purpose aperture 90 is not needed and the blocking plate may be dispensed with, if the other functions of the plate are not required or can be performed at another location. Stencil reticles and scattering reticles represent two extremes of reticle design. The former suffers from problems associated with the heat load on the reticle. The latter suffers from a substantial loss of current at the contrast aperture even from the "transparent" areas of the reticle.

Figure 2:
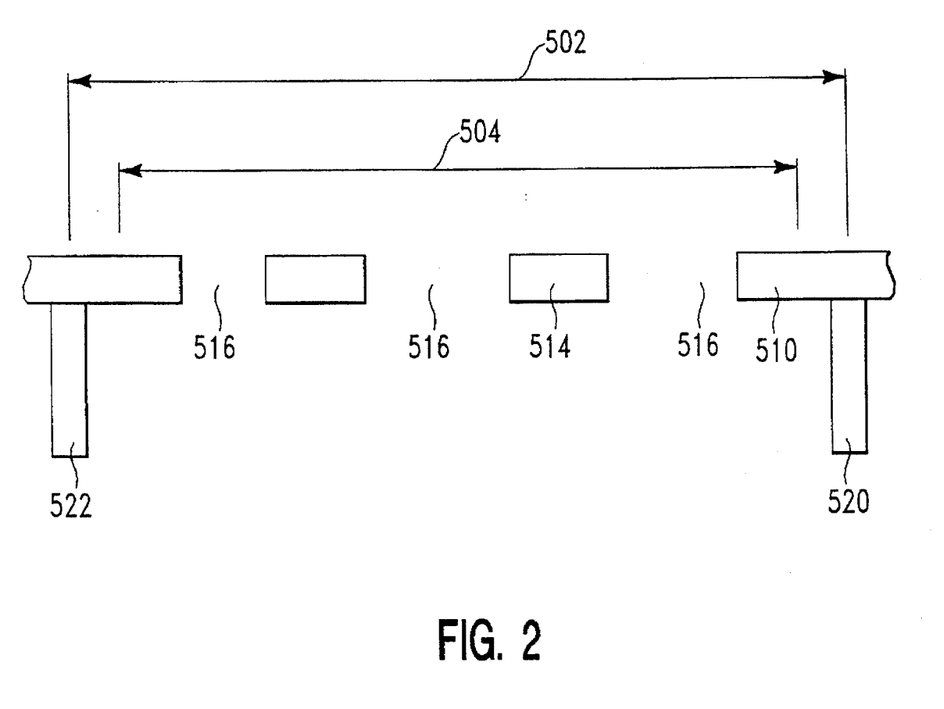
FIG. 2 illustrates a cross section of a reticle suitable for use with the invention.

In FIG. 2, there is illustrated in cross section a reticle of a novel type that may be used with the invention. Layer 510 is the main material of the reticle, illustratively Silicon. The thickness of layer 510 is set such that a substantial number (90%, say) of 100 kev electrons are scattered far enough to be intercepted by aperture 90. For Silicon, this thickness is approximately 1.0 μm. Struts 520 and 522 bracket the subfield illustrated. These struts are separated by a nominal distance indicated by the arrow labelled 502. The nominal usable dimension of the subfield is indicated by the arrow labelled 504 and is 1 mm in this example. Struts 520 have a nominal width and thickness of about 0.2 mm. They may be fabricated by conventional etching techniques. Aperture 516, represented here in the more common situation of a singly-connected area, is an opening in layer 510. Such a reticle has the advantage over a "differentially" scattering reticle that it will cause less over-all scattering (none in the openings). Consequently, substantially less current is lost at the contrast aperture. There will always be a background intensity on the wafer of electrons that were scattered so close to the forward direction that they pass through aperture 90. The thickness of the blocking areas will be selected to provide efficiency in removing electrons that pass through that area (which increases with increasing reticle thickness) adequate for the contrast of the resist process used, such that the fraction of electrons passing through the blocking area and the aperture do not cause appreciable resist exposure.

CALIBRATION AND ERROR CORRECTION

An advantageous feature of the present invention, combining as it does features of a probe-forming system with the projection technique, is that each subfield can be dynamically corrected for lens aberrations, thermal distortions, errors in the mechanical transport, etc. A system will initially be calibrated both in the aberrations for each subfield and also for the thermal effects from heat deposited by the beam in the course of operation. As the system handles each subfield, correction factors can be applied to the lenses, deflectors, and other corrective elements (quadrupoles, hexapoles, octupoles, etc.). In addition, the system may be used in closed loop fashion by directing a pulse of electrons at a dummy subfield at the periphery of the chip containing a pattern for calibration to be matched up with corresponding registration marks on the wafer. The accuracy of registration is checked by detecting electrons scattered from the registration marks and appropriate corrections are applied to the deflectors and/or other corrective elements.

ALTERNATIVE EMBODIMENTS

Figure 3A:
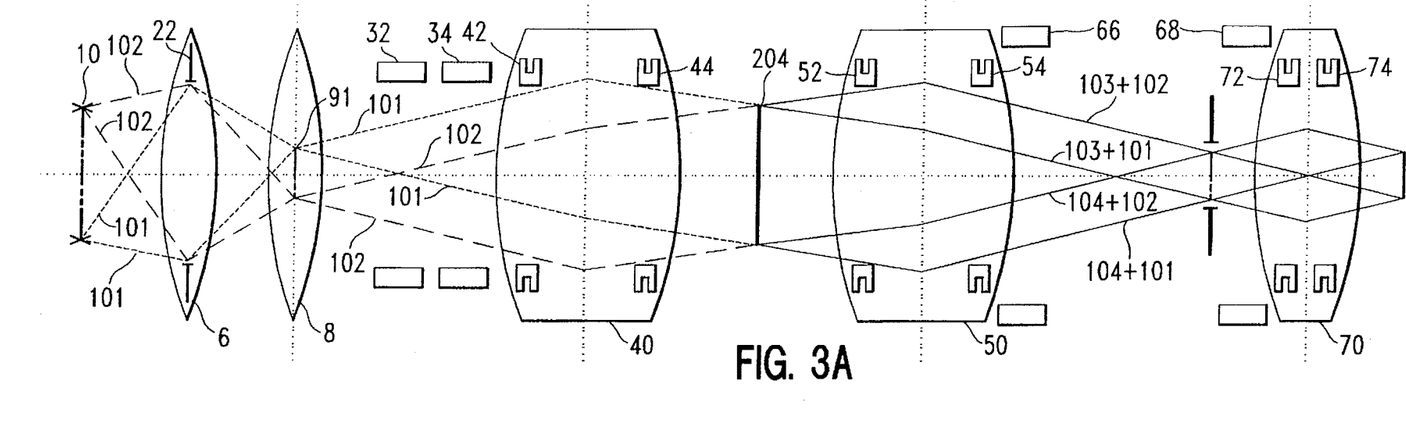
FIGS. 3A—and 3B illustrate alternative embodiments of the invention and corresponding beam tracings.
Figure 3B:
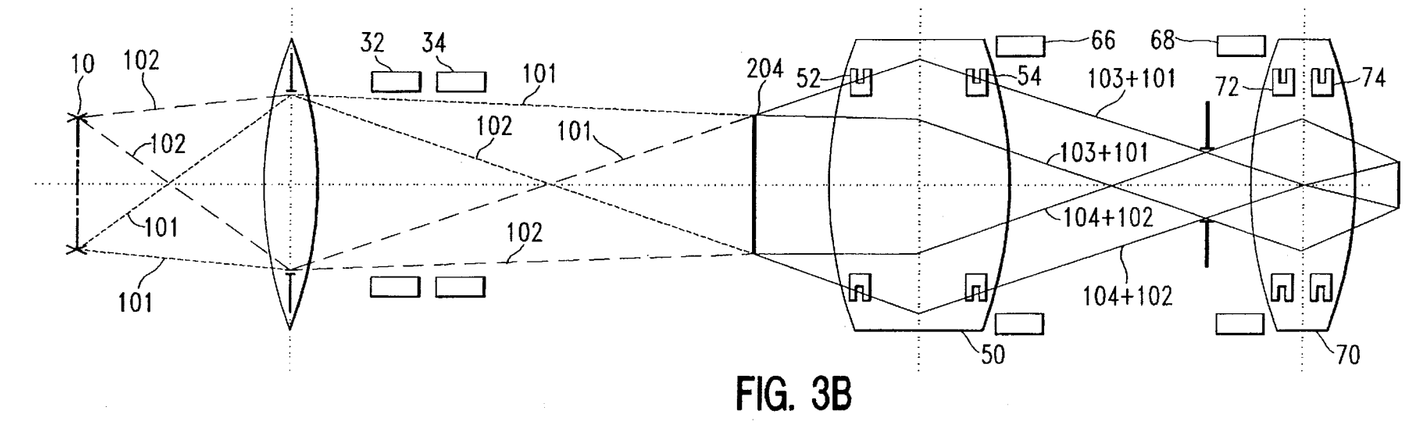

Referring now to FIGS. 3A and 3B, two alternative embodiments are shown, representing extreme cases, between which various combinations are possible. The lines shown do not exactly coincide with the actual trajectories of the beam electrons, but are schematic representations of first order optical principles known in the art as "Listing's image construction": Images of objects (including the source as well as any other physical entity like an aperture or a reticle) occur, where rays from one point on the object merge again, once or more often.

For the sake of clarity, in front (to the left in the figure) of the reticle 204 only rays serving to illuminate the reticle are shown (broken lines), whereas behind (to the right) of the reticle both illumination and reticle imaging rays (solid lines) are shown. Dotted lines 101 and dashed lines 102 represent rays emerging from the extreme points of the source 10, respectively, indicating the finite lateral extension or size of the source. Similarly, the solid lines 103 and 104 emerge from extreme points of the reticle, respectively. Note that one of the two rays labelled 103 coincides with the illumination ray 101, the other with 102. This graphically shows that each point on the reticle receives illumination from all points of the source. The same is true for the two rays labelled 104. Also, for the sake of clarity, the axis shifts required to scan the reticle with the beam are not illustrated in the figures. Only the corresponding elements, i.e. the deflection yokes 32 & 34, and 66 & 68, and the axis-shifting yokes in the VALs 40, 50, and 70, namely 42 & 44, 52 & 54, and 72 & 74 respectively, are represented symbolically by boxes, as are the lenses themselves by the bowed lines.

Figure 5A:
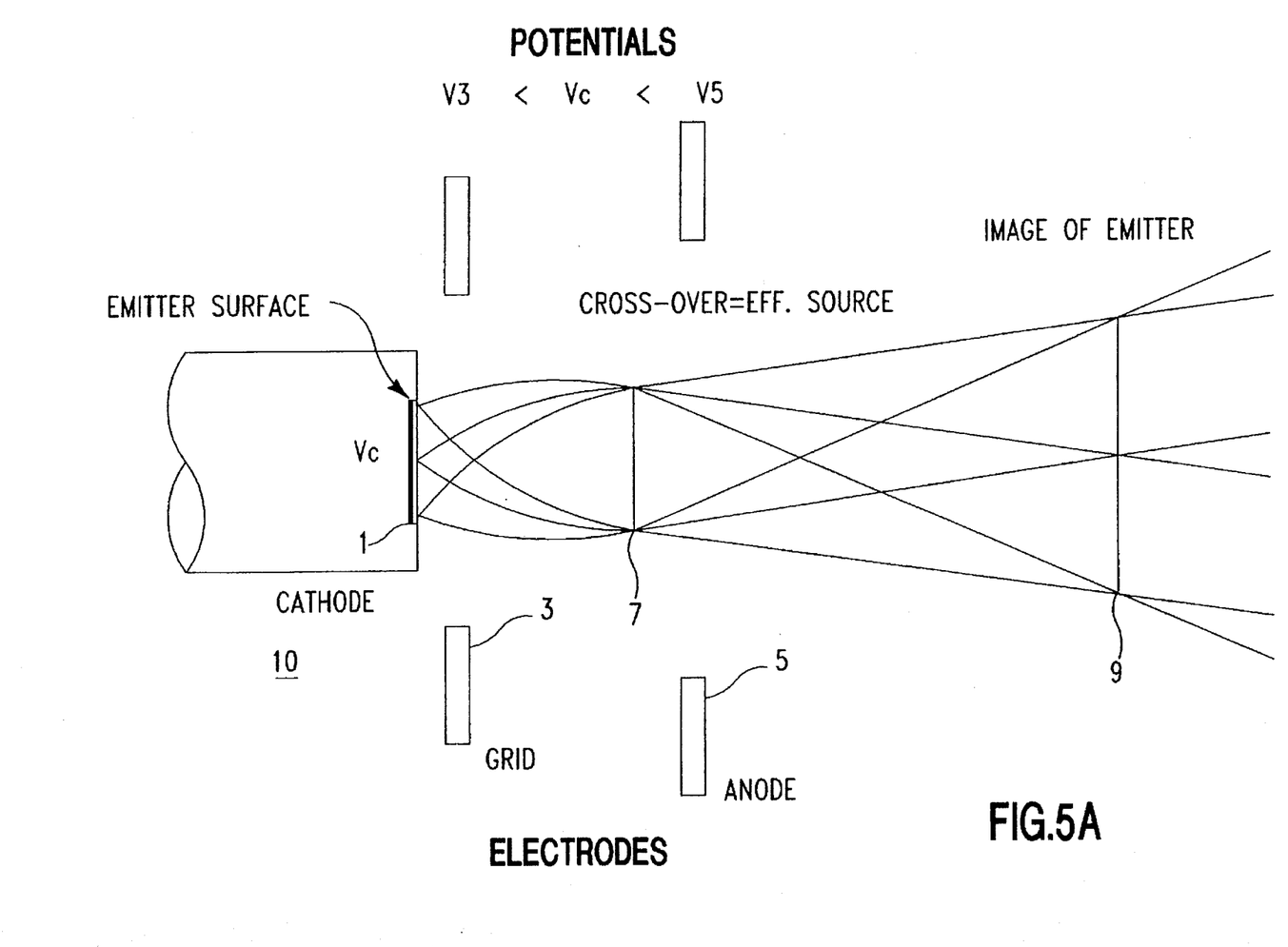
FIGS. 5A and 5B illustrate electron guns for use with the invention.
Figure 5B:
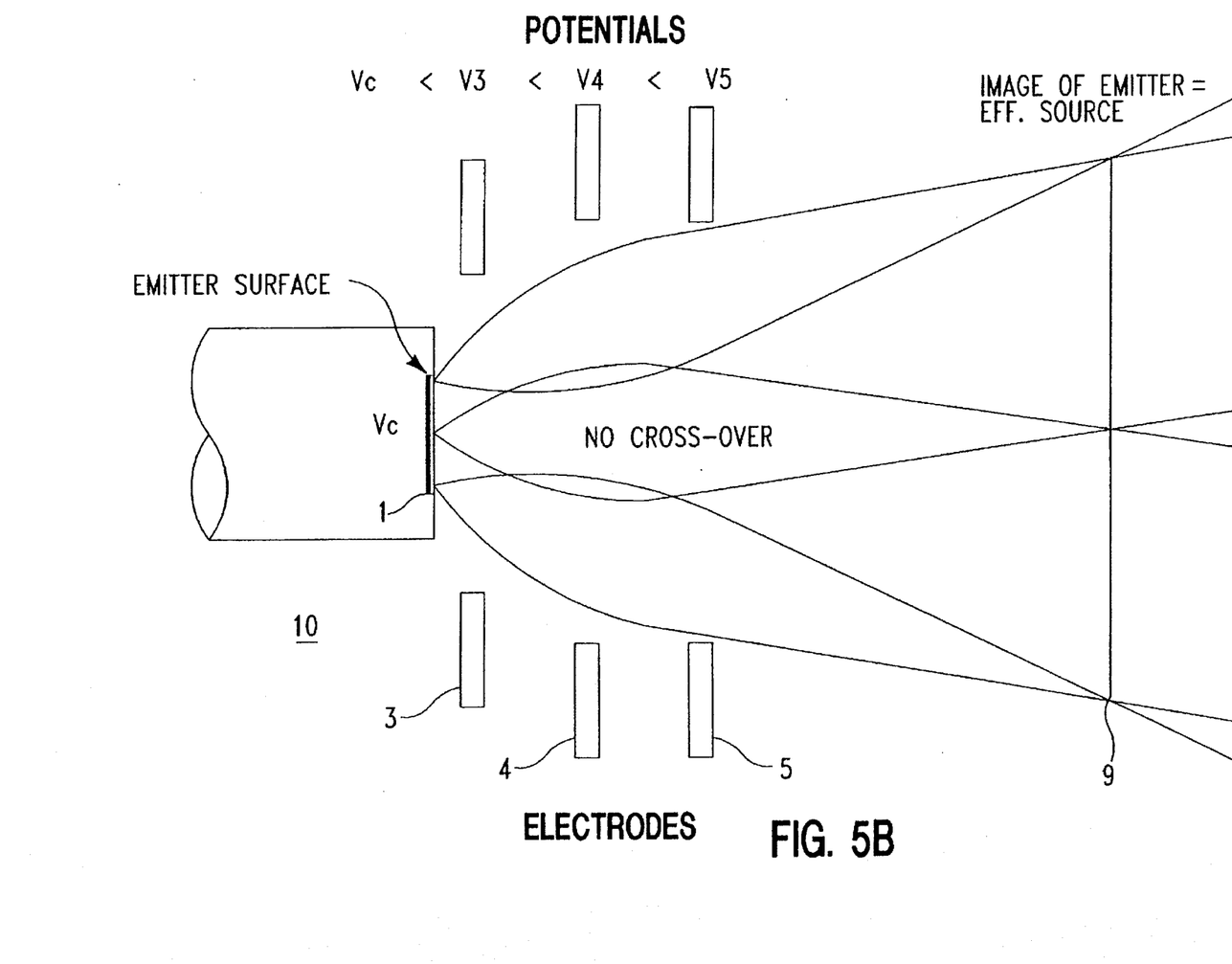

In FIG. 3A, lens 6 forms an image 91 of source 10 within lens 8. The source can be the electron emitting surface or its image, as shown in FIG. 5B; or an electron trajectory cross-over in front of the emitter, as depicted in FIG. 5A, at a position suitable for lenses 40 and 50 to form another image 92 of source 10 at aperture 90. The image at aperture 90 concentrates the unscattered radiation and therefore provides the most efficient separation of the unscattered radiation from the rays scattered by the portions of the reticle material representing "opaque" pattern sections into different solid angles. This separation is the mechanism of transforming the scatter distribution into intensity contrast in the target plane by virtue of aperture 90, which is one of its functions and which is therefore also referred to as a "contrast aperture".

The size of source image 92, determined by the size of source 10 and the total magnification of the optical system comprised of lenses 6, 8, 40, and 50, is important for the resolution performance of the entire projection system, since it controls the impact of the stochastic Coulomb interactions between the electrons on the image blur at the target. It should be noted here that, other than illustrated for clarity in FIG. 3A, the source image 92, and therefore the aperture 90, as well as the target, may actually be located within the magnetic field of lens 70, which for that reason would be called an immersion lens, accordingly denoted as VAIL (Variable Axis Immersion Lens), as it is an axis-shifting lens like lens 50. The lenses 50 and 70 act together as a system referred to in the art as a "doublet", performing the (reduction) projection of the reticle pattern 204 onto the target (wafer) 224. In addition, the function of VA(I)L 40 in this embodiment is to form an image of source 10 at aperture 90.

Between deflection elements 66 and 68, the image plane of the nth subfield is at infinity, i.e. the rays originating from the same point on the reticle are parallel or "collimated" in the familiar terminology of optics. As illustrated in FIG. 3A, rays from one reticle point are not parallel to rays from a different point, due to the finite lateral extension of the source 10 and its image 92.

In the embodiment depicted in FIG. 3B, source 10 is imaged by one lens, e.g. lens 8, into the reticle plane, and consequently the doublet projects a superimposed image of the source and the reticle pattern onto target 224. The omission of lens 40 is not crucial to the concept depicted here. The main difference between the embodiments of FIGS. 3a and 3b is the avoidance of a source image within the reticle imaging doublet. It doesn't matter if there is a source image upstream.

This approach provides more control over the beam diameter in the area of highest impact on the Coulomb interactions, between lenses 50 and 70, to keep it from shrinking too much at any point, and also provides more efficient utilization of the current emitted from the source, but places more stringent requirements on the source itself regarding uniformity of emission over its entire surface.

BRIGHTNESS CONSIDERATIONS

In a more generalized manner, brightness, a quantity of conservation in an (aberration-free) optical system, is defined as $Db=Di/(df \cdot d\Omega)$, where $Di$ is the fraction of the current passing through an infinitesimal cross-section area $df$ and entering into the solid angle element $d\Omega = 2\pi \sin\alpha \, d\alpha$, where $\alpha$ is the beam con/divergence semi-angle at $df$. In Gaussian probe-forming systems [as well as scanning electron microscopes and tunneling electron microscopes] which are primarily resolution driven, the resolution is directly coupled to the source image size and therefore requires its minimization. Furthermore, resolution improves with minimization of geometric and chromatic aberrations, which is achieved by reducing the numerical aperture or final beam semi-angle $\alpha$. Both requirements lead to the demand for high brightness, optimally achieved with point-source field emission guns.

In shaped beam systems, the brightness is somewhat lower than in probe-forming systems, even though the beam current is increased. The beam cross-section increases as well, since shaped-beam systems process a number (order 100) of pixels in parallel, partially offsetting the current increase. In addition, the semi-angle has to be increased as well rather than minimized, as the now noticeable Coulomb interactions, which are roughly inversely proportional to the angle, lead to a better trade-off against the geometrical aberrations at a higher value of $\alpha$. Still, the brightness requirement remains in the order of $10^5$ A/cm$^2$sr or more.

With reference to the final object image (the beam spot at the target) the brightness is calculated as: B=I/$\pi$(fNA)$^2\pi$(S/2f)$^2 \approx 0.4$I/NA$^2$S$^2$, where f is the focal length of the final projection lens 70 FIG. 3, NA is the final beam semiangle or numerical aperture, and S is the size of the image. A prior art high-brightness system used for the purpose of semiconductor circuit fabrication is described in Pfeiffer et al, JVST 12(6) 2332 (1993), showing the use of a beam current of 1 µA, a beam numerical aperture of 7 mrad, and a target spot of 2 µm, giving a brightness of about 2×10$^5$A/cm$^2$sr. In this system, the emittance is about 14 µm×mrad.

In contrast, the illustrative embodiment has a beam current of 50 µA, a numerical aperture of 4 mrad, and a subfield size at the target of 0.5 mm, giving a brightness of 500 µA/cm$^2$sr. Thus, the beam current has been increased by a factor of 50, while the brightness has been reduced by a factor of 400. The reduction in brightness in spite of the increase in current is enabled by an increase in emittance to about 500×4 µm×mrad. It has been found that an emittance of about 1000 µm×mrad is a suitable lower limit for a high-current, low-brightness system according to the present invention.

A parameter that illustrates sharply the difference between a system according to the present invention (a large area projection system, LAP) and the prior art variable shaped beam (VSB) systems is the emittance. In the prior art VSB systems, the shape object is substantially demagnified (50× –200×), while the source is simultaneously magnified by a similar factor.

Therefore VSB systems can operate with a small source (10–50 µm$\phi$) and still provide the relatively large numerical aperture (the angle under which the final source image is seen from the target plane) required to properly balance interaction and geometric aberration. In the LAP system, the object (reticle subfield) image is moderately demagnified (3×–5×), and the image of the source between the doublet lenses moderately or not at all magnified. Therefore the LAP system requires a very large source (>1 mm$\phi$) to provide a numerical aperture of comparable or even smaller magnitude than the VSB system.

The primary object in the LAP system (the reticle subfield) is 2×–4× larger than the corresponding feature (the shape object) of the VSB system. Both have to be illuminated uniformly to within at least 2%, the LAP system more stringently to within less than 1%. Since the overall distribution of the current emitted from the gun is never uniform, the gun for a LAP system is required to emit into a substantially $\approx$10× as compared to VSB) larger illumination angle of the (primary) object to provide the uniformity necessary for both the large object size and the tighter tolerance.

Both of the above considerations translate into the orders of magnitude larger gun emittance of the LAP system, surpassing the larger current and thus effectively reducing the brightness.

In projection systems of the sort illustrated herein, where the current required for competitive throughput is approximately 100–1000 times higher than in a Gaussian probe-forming system and 10–50 times greater than in a shaped-beam system, one skilled in the art would expect that the brightness would have to be increased in order to provide the high current. It has been found that, contrary to what would have been expected, that the required brightness associated with a projection system having a current of tens of microamperes is lower than that for a shaped beam system having one microampere, not higher. Indeed, high brightness is detrimental because it results in excessive aberrations from Coulomb repulsion of the beam electrons.

It has been found that in projection beam systems according to the invention, it is not enough to make the path between the reticle and the wafer short in order to limit the now dominant and therefore throughput-limiting Coulomb interactions, but that adequate resolution can be achieved only with an even more pronounced increase of the (minimum) beam cross-section, determined, as explained above, primarily by the effective source size. At beam semi-angles of similar magnitude, the brightness requirement is drastically reduced to the order of 10$^3$ A/cm$^2$sr. This range of brightness is required in order to achieve a goal of total beam current in the range of above 10 µA while still maintaining stochastic interaction within a range that will not interfere with feature resolution in the range of <0.2 µm.

As has been known in the art, a small source size such as that produced by the generation of a beam crossover smaller in diameter than the actual emitting surface is preferred in order to suppress variations in the current emitted over the emitting surface. It has also been known that a larger beam semiangle results in greater excursions from the axis into areas where the field has greater aberrations than on the axis. Thus, those skilled in the art kept the source size and the beam semiangle small (about 10 µm for the crossover diameter and a few milliradians for the final beam semiangle).

Figure 4A:
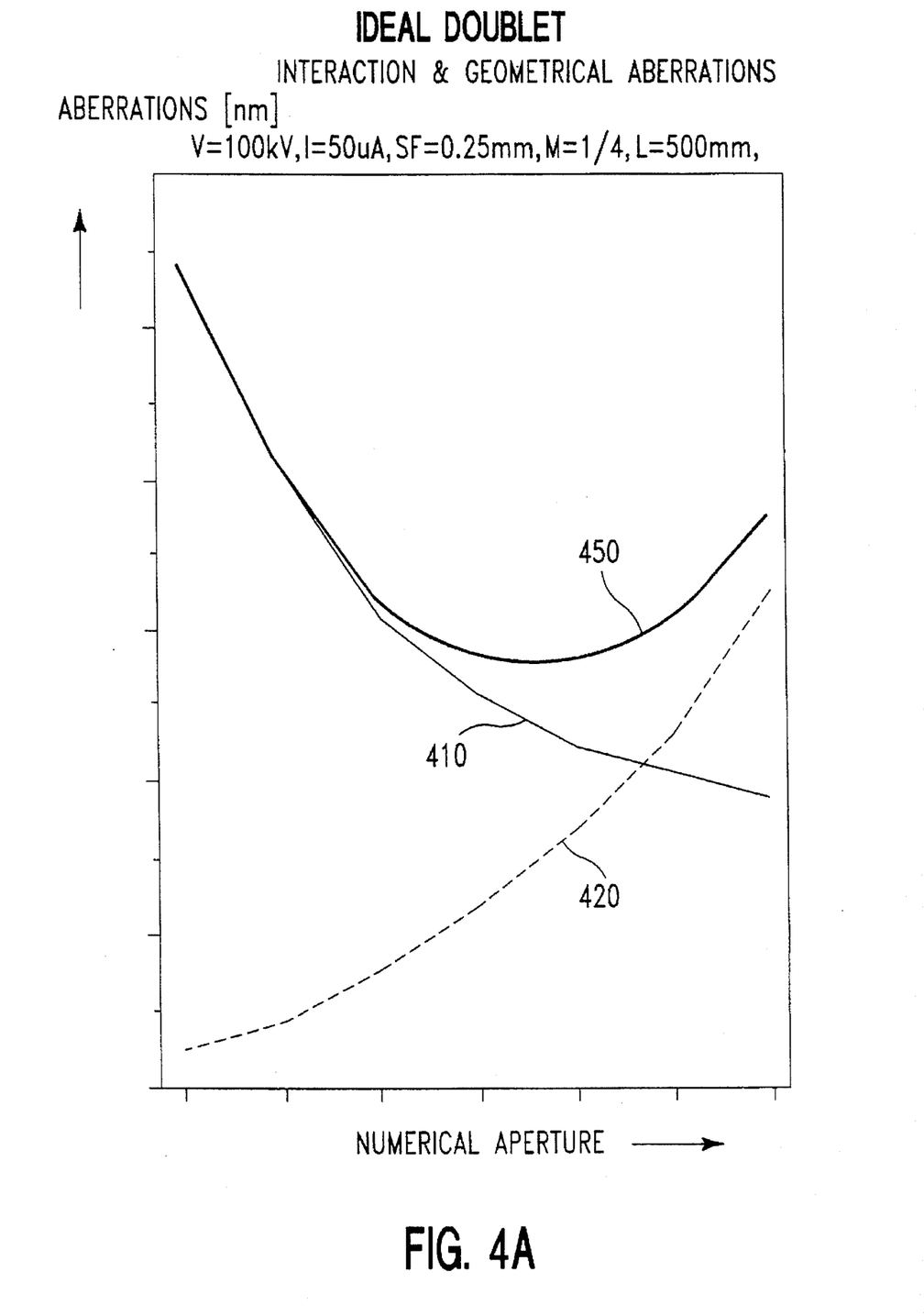
FIGS. 4A—and 4B illustrate composite beam aberrations as a function of numerical aperture and subfield image size, respectively.
Figure 4B:
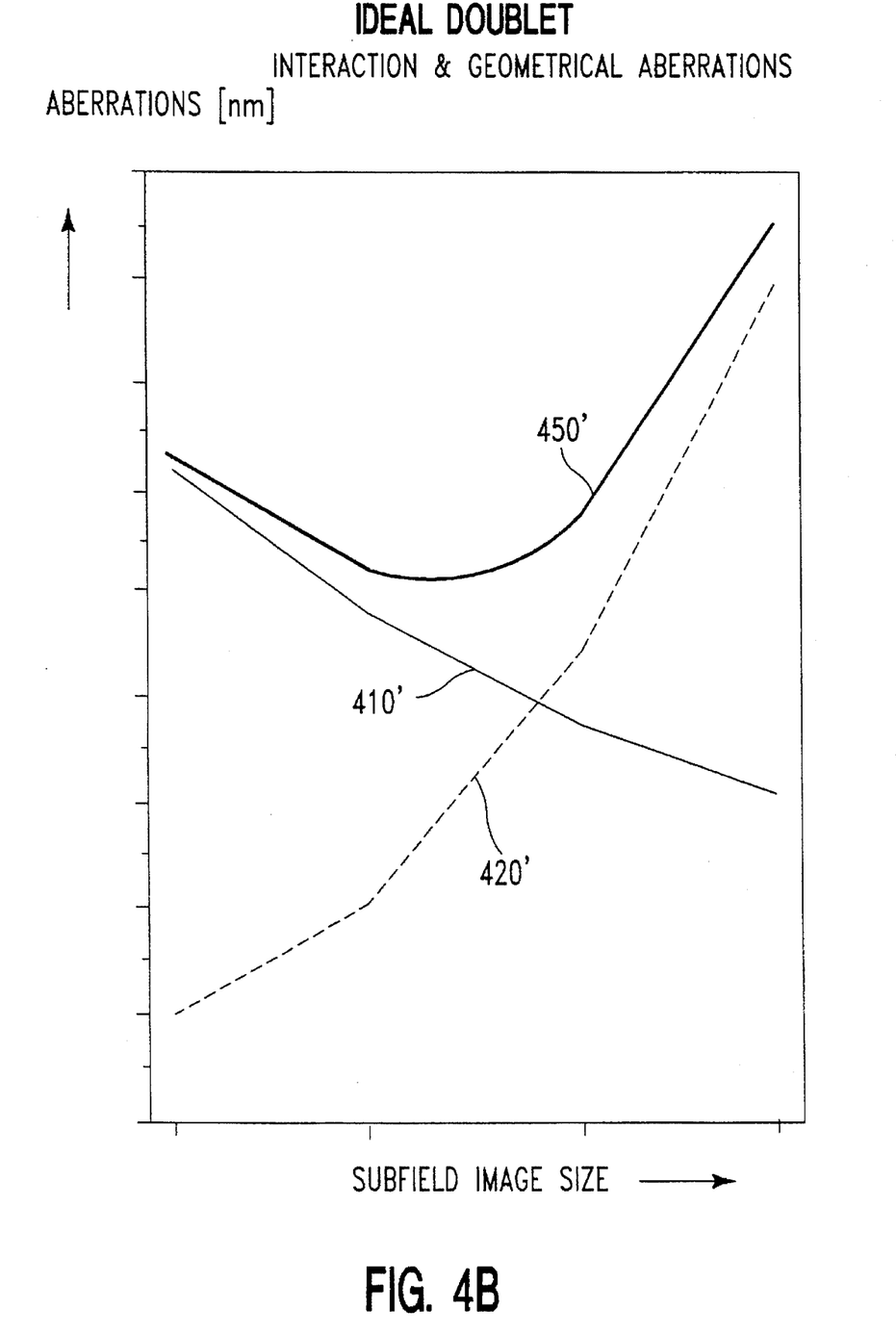

The trade-off between geometric aberrations and image blur caused by interactions is illustrated in FIG. 4A as a function of the numerical aperture of the projection system, and in FIG. 4B as a function of the subfield size imaged at any one instant. Curve 450 in FIG. 4A shows in quadrature the combined effects of curve 410 (trajectory displacement from Coulomb interactions) and curve 420 (geometric aberrations) as a function of numerical aperture. Curve 450' in FIG. 4B similarly shows the combination of curve 410' (trajectory displacement from Coulomb interactions) and curve 420' (geometric aberrations) as a function of subfield image size. in each case, there is a preferred minimum distortion point that is associated with a numerical aperture of about 5 mrad and a subfield image size of about 1 mm, respectively. Different systems will have different values for the minimum distortion, of course. The numerical aperture is defined by the diameter of aperture 90 and the focal length of lens 70. In both cases, the beam current is 50 µA, the beam energy is 100 keV and the demagnification is 4:1. As can be seen in the figures, there is a minimum-aberration region that is the preferred operating range.

SOURCE EMBODIMENTS

FIG. 5A and 5B illustrate two fundamental types of electron guns. FIG. 5A represents the typical, widely employed triode gun with the emitter at cathode potential (negative high voltage $V_c$), and the anode at ground potential ($V_s$), thus causing the electrons emerging from the emitter surface usually due to elevated temperature to be accelerated toward the anode. The third electrode, the grid or Wehnelt electrode, is at a potential $V_3$ more negative than $V_c$, thereby serving to control not only the total emission, but also causing the formation of an electron trajectory cross-over (indicated by the line denoted with numeral 7), which then acts as the effective source for the beam penetrating the aperture in anode 5. This type of gun will be referred to as a crossover electron gun. The three electrodes form an electrostatic lens, which, in addition to the cross-over, forms an image of the emitter surface farther away than the cross-over. In a typical system, the distance from cathode 1 to crossover 7 is on the order of 1 mm and the distance from cathode 1 to image 9 is on the order of 10 cm. This can be advantageously exploited e.g. by a system represented in FIG. 3A. Placing the emitter image at aperture 20, with an aperture opening slightly smaller than the image size facilitates optimum utilization of the emission current, as most of it penetrates the aperture. Since the aperture then is imaged on the reticle in the embodiment of FIG. 3A, a very stringent requirement has to be imposed on the quality of the emitting surface to provide uniform illumination of the reticle. Aside from the difficulty of meeting this requirement, the crossover still determines the narrowest width of the beam in the critical area within the doublet of the projection system. This illumination concept is known as "critical Koehler" illumination (Essig & Pfeiffer, JVST 1986). The size of the cross-over is independent of the emitter surface size to a large extent. Therefore the additional difficulty of controlling the cross-over size, or, more to the point, to make it large enough to alleviate the Coulomb interaction effect downstream of the gun, renders this illumination concept, albeit of high efficiency, less suitable for the application to a large field projection system.

FIG. 5B depicts a concept considered to be more suitable and therefore the preferred embodiment. One or more additional electrodes in the form of plates with apertures and proper choice of the potentials as illustrated prevent the formation of the cross-over in front of the emitter. In this embodiment, the image 9 of the emitter surface (which may exist in real space downstream of the gun or as a virtual image upstream) represents the source. Its size can be controlled much more easily by adjustment of the voltages on the electrodes, in a manner familiar to those skilled in the art. Guns of this type from which the beam continuously expands will be referred to as diverging-beam guns, since the beam does not converge to form a crossover. Since all the other electrodes are more positive in voltage than the cathode, control of the total emission current becomes more difficult than in the embodiment of FIG. 5A and, in the case of a thermionic emitter, has to be provided by regulation of its temperature.

This concept is suitable for all the embodiments encompassed by those shown in FIGS. 3A and 3B, but only in the case of the latter would the above mentioned stringent quality requirement have to be imposed on the emitter. For the former, FIG. 3A, a reasonable demand would have to be placed on the uniformity of the emission cone emerging from the gun, in the interest of efficient utilization of the total emission current.

In contrast to the prior art, It has been found that the emitting cathode area of the gun in a system according to the invention should be on the order of 1 mm$^2$ and larger. The generation of such a large (1–50 mm$^2$) emitting surface may be accomplished with a number of materials such as the use of a flat thermionic rod instead of a pointed tip, e.g. as taught in Y. Furukawa et al; by the use of a (patterned) photocathode, e.g. as taught in E. J. P. Santos and N. C. McDonald; by the use of a thin-film diamond cathode, e.g. as taught in R. D. Scarpetti et al, by the use of a plasma discharge source, e.g. as taught in T-Y. Hsu et al., SPIE Vol. 2194, 274 (1994); by the use of a planar cold cathode, e.g. as taught in U. K. Mishra and W. N. Jiang, Proc. IEEE/Cornell Conf. Adv. Concepts in High-Speed Semiconductor Devices & Circuits, 1992, p. 279; by the use of a field emitter array, e.g. as taught in S. Iannazo Solid State Electronics V. 36(3), 301 (1992); or by the use of a ferroelectric cathode, e.g. as taught in B. Jiang et al, Appl Phys. Lett V66, #10, 1196, (1995).

Those skilled in the art will readily be able to devise other embodiments of the invention than that illustrated and the scope of the following claims is not meant to be limited to the embodiments shown.

We claim:

1. A projection E-beam system for writing a pattern on a wafer comprising:
    an electron source and means for accelerating an electron beam along a system axis comprising an emitting cathode having an emitting cathode area and an accelerating anode that combine to transport a diverging initial electron beam having a current greater than 10 µA and having a brightness less than 10$^3$/cm$^2$sr from said emitting cathode toward a reticle carrying a reticle pattern in a plurality of reticle subfields, each having a subfield area;
    means for directing said electron beam through an nth subfield in said reticle, whereby said beam is patterned with an nth subfield portion of said reticle pattern; and
    magnetic focus means disposed along said system axis and intercepting said electron beam for projecting an image of said nth subfield carried by said electron beam on a wafer to form an nth wafer subfield corresponding to said nth subfield portion of said reticle pattern.

2. A system according to claim 1, in which said emitting cathode area is greater than said subfield area.

3. A system according to claim 2, further comprising a diverging-beam electron gun having an emitting surface area generates a beam having a beam cross section that increases monotonically until said beam reaches a first lens in said system.

4. A system according to claim 3, further comprising an emittance greater than 1000 µmxmrad.

5. A system according to claim 2, further comprising a crossover electron gun having an emitting surface area generates a beam having a beam cross section that increases in diameter and then converges to a crossover comparable in area to said emitting surface area, after which said beam cross section increases in diameter until said beam reaches a first lens in said system.

6. A system according to claim 5, further comprising an emittance is greater than 1000 µmxmrad.

7. A system according to claim 1, further comprising a diverging-beam electron gun having an emitting surface area generates a beam having a beam cross section that increases monotonically until said beam reaches a first lens in said system.

8. A system according to claim 7, further comprising emittance greater than 1000 µmxmrad.

9. A system according to claim 1, further comprising a crossover electron gun having an emitting surface area generates a beam having a beam cross section that increases in diameter and then converges to a crossover comparable in area to said emitting surface area, after which said beam cross section increases in diameter until said beam reaches a first lens in said system.

10. A system according to claim 9, further comprising an emittance is greater than 1000 μmxmrad.

11. A projection E-beam system for writing a pattern on a wafer comprising:

an electron source and means for accelerating an electron beam along a system axis comprising an emitting cathode and an accelerating anode that combine to transport a diverging initial electron beam having a current greater than 10 μA and having an emittance greater than 1000 μmxmrad from said emitting cathode toward a reticle carrying a reticle pattern in a plurality of reticle subfields;

means for directing said electron beam through an nth subfield in said reticle, whereby said beam is patterned with an nth subfield portion of said reticle pattern; and magnetic focus means disposed along said system axis and intercepting said electron beam for projecting an image of said nth subfield carried by said electron beam on a wafer to form an nth wafer subfield corresponding to said nth subfield portion of said reticle pattern.

12. A system according to claim 11, further comprising an emitting cathode area is greater than said subfield area.

13. A system according to claim 12, further comprising a diverging-beam electron gun having an emitting surface area generates a beam having a beam cross section that increases monotonically until said beam reaches a first lens in said system.

14. A system according to claim 13, in which said emitting surface area is greater than 1 mm$^2$.

15. A system according to claim 12, further comprising a crossover electron gun having an emitting surface area generates a beam having a beam cross section that increases in diameter and then converges to a crossover comparable in area to said emitting surface area, after which said beam cross section increases in diameter until said beam reaches a first lens in said system.

16. A system according to claim 15, in which said emitting surface area is greater than 1 mm$^2$.

17. A system according to claim 11, further comprising a diverging-beam electron gun having an emitting surface area generates a beam having a beam cross section that increases monotonically until said beam reaches a first lens in said system.

18. A system according to claim 11, further comprising a crossover electron gun having an emitting surface area generates a beam having a beam cross section that increases in diameter and then converges to a crossover comparable in area to said emitting surface area, after which said beam cross section increases in diameter until said beam reaches a first lens in said system.

* * * * *